United States Patent
Bedell et al.

(10) Patent No.: US 8,969,174 B2
(45) Date of Patent: Mar. 3, 2015

(54) FIXED CURVATURE FORCE LOADING OF MECHANICALLY SPALLED FILMS

(71) Applicant: International Business Machines Corporation, Armonk, NY (US)

(72) Inventors: Stephen W. Bedell, Wappingers Falls, NY (US); Keith E. Fogel, Hopewell Junction, NY (US); Paul A. Lauro, Brewster, NY (US); Xiao H. Liu, Briarcliff Manor, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/168,471

(22) Filed: Jan. 30, 2014

(65) Prior Publication Data
US 2014/0147988 A1 May 29, 2014

Related U.S. Application Data

(62) Division of application No. 13/215,738, filed on Aug. 23, 2011, now Pat. No. 8,679,943.

(51) Int. Cl.
*H01L 21/30* (2006.01)
*H01L 31/18* (2006.01)

(52) U.S. Cl.
CPC ............ *H01L 21/30* (2013.01); *H01L 31/1892* (2013.01); *Y02E 10/50* (2013.01)
USPC ........................................................ 438/458

(58) Field of Classification Search
USPC .................... 257/E21.211; 438/458
See application file for complete search history.

(56) References Cited

U.S. PATENT DOCUMENTS

| 4,582,559 | A  | * | 4/1986 | Tanielian et al. | ......... 204/192.25 |
| 6,452,091 | B1 |   | 9/2002 | Nakagawa et al. | |
| 8,003,492 | B2 | * | 8/2011 | Gmitter et al. | ................. 438/458 |
| 8,247,261 | B2 |   | 8/2012 | Bedell et al. | |
| 8,709,914 | B2 | * | 4/2014 | Bedell et al. | .................. 438/458 |

(Continued)

FOREIGN PATENT DOCUMENTS

EP 0965664 A1 12/1999

OTHER PUBLICATIONS

Search and Examination Report dated Oct. 30, 2012, issued by the U.K Intellectual Property Office, received in a corresponding foreign application.

*Primary Examiner* — Thao P Le
(74) *Attorney, Agent, or Firm* — Scully, Scott, Murphy & Presser, P.C.; Louis J. Percello, Esq.

(57) ABSTRACT

A spalling method is provided that includes depositing a stressor layer on surface of a base substrate, and contacting the stressor layer with a planar transfer. The planar transfer surface is then traversed along a plane that is parallel to and having a vertical offset from the upper surface of the base substrate. The planar transfer surface is traversed in a direction from a first edge of the base substrate to an opposing second edge of the base substrate to cleave the base substrate and transfer a spalled portion of the base substrate to the planar transfer surface. The vertical offset between the plane along which the planar transfer surface is traversed and the upper surface of the base substrate is a fixed distance. The fixed distance of the vertical offset provides a uniform spalling force. A spalling method is also provided that includes a transfer roller.

16 Claims, 3 Drawing Sheets

(56) References Cited

U.S. PATENT DOCUMENTS

2007/0249140 A1 10/2007 Dross et al.
2010/0289189 A1 11/2010 Lichtensteiger et al.
2010/0311250 A1 12/2010 Bedell et al.

* cited by examiner

FIXED CURVATURE FORCE LOADING OF MECHANICALLY SPALLED FILMS

CROSS REFERENCE TO RELATED APPLICATION

This application is a divisional of U.S. patent application Ser. No. 13/215,738, filed Aug. 23, 2011 the entire content and disclosure of which is incorporated herein by reference.

BACKGROUND

The present disclosure relates to electrical device manufacturing, and more particularly to spalling methods.

One method for transferring thin crystalline layers from a source substrate to another substrate (plastic, glass, metal, etc) is controlled substrate spalling. In this method, the surface of a substrate is removed by depositing a stressed material (e.g., metal) on the surface to be cleaved, i.e., base substrate, in which the thickness and stress values of the stressed material are below that required for spontaneous base substrate spalling, but are high enough to permit spalling after fracture initiation. Controlled spalling offers a low cost, simple approach for removing many thin semiconductor layers from a comparatively expensive thick base substrate.

SUMMARY

The present disclosure provides a method to control the fracture of a base substrate during spalling. In one embodiment, the spalling method includes depositing a stressor layer on a surface of a base substrate and contacting the stressor layer with a planar transfer surface at a first edge of the base substrate. Following contact of the planar transfer surface to the stressor layer, the planar transfer surface is traversed along a plane that is parallel to and vertically offset from the upper surface of the base substrate in a direction from the first edge of the base substrate to an opposing second edge of the base substrate. The vertical offset between the plane along which the planar transfer surface is traversed, and the upper surface of the base substrate is a fixed distance along the width of the base substrate from the first edge of the base substrate to the second edge of the base substrate. Traversing the planar transfer surface from the first edge of the base substrate to a second edge of the base substrate cleaves the base substrate and transfers a spalled portion of the base substrate to the planar transfer surface. The fixed distance that provides the vertical offset between the plane along which the planar transfer surface is traversed and the upper surface of the base substrate contributes to providing a uniform spalling force. In some embodiments, the spalling method further includes rollers to ensure substantially void free bonding of the spalled portion of the base substrate to the planar transfer surface.

In another embodiment, a method of transferring a material layer, for example, by spalling, is provided that includes depositing a stressor layer on surface of a base substrate. The stressor layer may then be contacted with a transfer roller at a first edge of the base substrate, wherein the radius of transfer roller is selected to provide a roller having a curvature that is equal to an equilibrium curvature of the material layer being transferred from the base substrate to the transfer roller. Following contact of the transfer roller to the stressor layer, the transfer roller is traversed from the first edge of the base substrate to an opposing second edge of the base substrate. Traversing the transfer roller from the first edge of the base substrate to a second edge of the base substrate cleaves the base substrate and transfers a spalled portion of the base substrate to the transfer roller.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
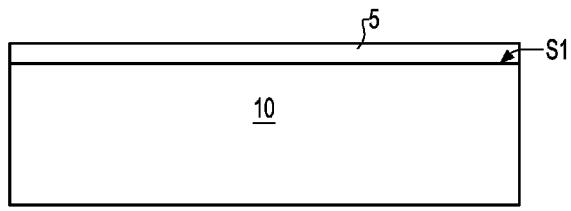
FIG. 1 is a side cross-sectional view illustrating depositing a stressor layer on a surface of a base substrate, in accordance with one embodiment of the present disclosure.

Detailed embodiments of the present disclosure are described herein; however, it is to be understood that the disclosed embodiments are merely illustrative of the structures and method described herein that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the disclosed methods and structures.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

FIGS. 1-6 depict one embodiment of a spalling method that includes depositing a stressor layer 5 on an upper surface S1 of a base substrate 10, contacting the stressor layer 5 with a planar transfer surface 15 at a first edge E1 of the base substrate 10, and traversing the planar transfer surface 15 along a plane P1 that is parallel to and having a vertical offset from the upper surface S1 of the base substrate 10 in a direction from the first edge E1 of the base substrate 10 to an opposing second edge E2 of the base substrate 10 to cleave the base substrate 10 and transfer a spalled portion 11 of the base substrate 10 to the planar transfer surface 15. As will be described in greater detail below, the vertical offset D1 between the plane P1 along which the planar transfer surface 15 is traversed and the upper surface S1 of the base substrate 10 is a fixed distance that separates the planar transfer surface 15 from the upper surface S1 of the base substrate 10, as the planar transfer surface 15 is traversed across the entire width W1 of the base substrate 10, which provides a uniform spalling force. By "uniform spalling force" it is meant that the force that maintains the crack propagation that cleaves the base substrate 10 is substantially the same across the entire width W1 of the base substrate 10. By "substantially the same" it is meant that the difference in the force that propagates the crack across the base substrate is less than a 10% difference.

FIG. 1 illustrates one embodiment of depositing a stressor layer 5 on an upper surface S1 of a base substrate 10. The base substrate 10 employed in the present disclosure may comprise a semiconductor material, a glass, a ceramic, or any another material whose fracture toughness is less than that of the stressor layer 5 that is to be subsequently formed. Fracture toughness is a property which describes the ability of a material containing a crack to resist fracture. When the base substrate 10 comprises a semiconductor material, the semiconductor material may include, but is not limited to, Si, Ge, SiGe, SiGeC, SiC, Ge alloys, GaSb, GaP, GaN, GaAs, InAs, InP, $Al_2O_3$ and all other III-V or II-VI compound semiconductors, individually or in combination. In some embodiments, the base substrate 10 is a bulk semiconductor material. In other embodiments, the base substrate 10 may comprise a layered semiconductor material such as, for example, a semiconductor-on-insulator or heteroepitaxial layers grown on a single-crystal substrate. Illustrated examples of semiconductor-on-insulator substrates that can be employed as base substrate 10 include silicon-on-insulators and silicon-germanium-on-insulators. When the base substrate 10 comprises a semiconductor material, the semiconductor material can be doped, undoped or contain doped regions and undoped regions.

In one embodiment, the semiconductor material that can be employed as the base substrate 10 can be single-crystalline (i.e., a material in which the crystal lattice of the entire sample is continuous and unbroken to the edges of the sample, with no grain boundaries). In another embodiment, the semiconductor material that can be employed as the base substrate 10 can be polycrystalline (i.e., a material that is composed of many crystallites of varying size and orientation; the variation in direction can be random (called random texture) or directed, possibly due to growth and processing conditions). In yet another embodiment of the present disclosure, the semiconductor material that can be employed as the base substrate 10 can be amorphous (i.e., a non-crystalline material that lacks the long-range order characteristic of a crystal). Typically, the semiconductor material that can be employed as the base substrate 10 is a single-crystalline material.

When the base substrate 10 comprises a glass, the glass can be an $SiO_2$-based glass which may be undoped or doped with an appropriate dopant. Examples of $SiO_2$-based glasses that can be employed as the base substrate 10 include undoped silicate glass, borosilicate glass, phosphosilicate glass, fluorosilicate glass, and borophosphosilicate glass.

When the base substrate 10 comprises a ceramic, the ceramic is any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

In some embodiments of the present disclosure, the upper surface S1 of the base substrate 10 can be cleaned prior to further processing to remove surface oxides and/or other contaminants therefrom. In one embodiment of the present disclosure, the base substrate 10 is cleaned by applying to the base substrate 10 a solvent such as, for example, acetone and isopropanol, which is capable of removing contaminates and/or surface oxides from the upper surface S1 of the base substrate 10.

In some embodiments, an optional metal-containing adhesion layer (not shown) can be employed in embodiments in which the stressor layer 5 to be subsequently formed has poor adhesion to the material of the base substrate 10. Typically, the optional metal-containing adhesion layer is employed when a stressor layer 5 is comprised of a metal. The optional metal-containing adhesion layer that can be employed in the present disclosure includes any metal adhesion material such as, but not limited to, Ti/W, Ti, Cr, Ni or any combination thereof. The optional metal-containing adhesion layer may comprise a single layer or it may include a multilayered structure comprising at least two layers of different metal adhesion materials. The optional metal-containing adhesion layer can be formed at room temperature (15° C.-25° C.) or above. In one embodiment, the optional metal-containing adhesion layer is formed at a temperature, which is from 20° C. to 180° C. In another embodiment, the optional metal-containing adhesion layer is formed at a temperature, which is from 20° C. to 60° C.

The optional metal-containing adhesion layer can be formed utilizing deposition techniques, such as sputtering, chemical vapor deposition, plasma enhanced chemical vapor deposition, chemical solution deposition, physical vapor deposition, and plating. When sputter deposition is employed, the sputter deposition process may further include an in-situ sputter clean process before the deposition. When employed, the optional metal-containing adhesion layer typically has a thickness of from 5 nm to 200 nm, with a thickness of from 100 nm to 150 nm being more typical. Other thicknesses for the optional metal-containing adhesion layer that are below and/or above the aforementioned thickness ranges can also be employed in the present disclosure.

In one embodiment, the stressor layer 5 is located atop, and in direct contact with, the upper surface S1 of the base substrate 10. In another embodiment and when a metal-containing adhesion layer is present, the stressor layer 5 is in direct contact with the upper surface of the metal-containing adhesion layer. The stressor layer 5 that is formed atop upper surface S1 of base substrate 10 has a critical thickness and stress value that cause spalling mode fracture to occur within the base substrate 10. By "spalling mode fracture" it is meant that a crack is formed within base substrate 10 and the combination of loading forces maintain a crack trajectory at a depth below the stressor/substrate interface. By "critical condition", it is meant that for a given stressor material and substrate material combination, a thickness value and a stressor value for the stressor layer is chosen that render spalling mode fracture possible (can produce a $K_I$ value greater than the $K_{IC}$ of the substrate).

Specifically, the thickness of the stressor layer 5 is chosen to provide the desired fracture depth within the base substrate 10. For example, if the stressor layer 5 is chosen to be Ni, then fracture will occur at a depth below the stressor layer 5 roughly 2 to 3 times the Ni thickness. The stress value for the stressor layer 5 is then chosen to satisfy the critical condition for spalling mode fracture. This can be estimated by inverting the empirical equation given by $t^* = \{(2.5 \times 10^6 (K_{IC}^{3/2})\}/\sigma^2$, where $t^*$ is the critical stressor layer thickness (in microns), $K_{IC}$ is the fracture toughness (in units of MPa·m$^{1/2}$) of the base substrate 10 and $\sigma$ is the stress value of the stressor layer (in MPa). The above expression is a guide, in practice, spalling can occur at stress or thickness values up to 20% less than that predicted by the above expression.

In accordance with the present disclosure, the stressor layer 5 is under tensile stress while present on the base substrate 10 at the spalling temperature. Illustrative examples of materials that can be employed as the stressor layer 5 include, but are not limited to, a metal, a polymer, such as a spall inducing tape layer, or any combination thereof. The stressor layer 5 may comprise a single stressor layer, or a multilayered stressor structure including at least two layers of different stressor material can be employed.

In one embodiment, the stressor layer 5 is composed of a metal. When a metal is employed as the stressor layer 5, the metal can include, for example, Ni, Ti, Cr, Fe or W. Alloys of these metals can also be employed. In one embodiment, the stressor layer 5 includes at least one layer consisting of Ni. In another embodiment, the stressor layer 5 includes a polymer. When a polymer is included with the stressor layer 5, the polymer is a large macromolecule composed of repeating structural units. These subunits are typically connected by covalent chemical bonds. Illustrative examples of polymers that can be included with the stressor layer 5 include, but are not limited to, polyimides, polyesters, polyolefins, polyacrylates, polyurethane, polyvinyl acetate, and polyvinyl chloride.

In yet another embodiment, the stressor layer 5 includes a spall inducing tape. In another embodiment, for example, the stressor layer 5 may comprise a two-part stressor layer including a lower part and an upper part. The upper part of the two-part stressor layer can be comprised of a spall inducing tape layer. When a spall inducing tape layer is employed as the stressor layer 5, the spall inducing tape layer includes any pressure sensitive tape. By "pressure sensitive tape," it is meant an adhesive tape that will stick with application of pressure, without the need for solvent, heat, or water for activation.

Typically, the pressure sensitive tape that is included in the present disclosure with stressor layer 5 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 5 employed in the present disclosure are formed at a temperature which is at room temperature (15° C.-40° C.). In another embodiment, when a tape layer is included, the tape layer can be formed at a temperature which is from 15° C. to 60° C.

When the stressor layer 5 is comprised of a metal or polymer, the stressor layer 5 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating.

When the stressor layer 5 includes a spall inducing tape layer, the tape layer can be applied by hand or by mechanical means to the structure. Some examples of spall inducing tapes that can be used in the present disclosure as the stressor layer 5 include, for example, Nitto Denko 3193MS thermal release tape, Kapton KPT-1, and Diversified Biotech's CLEAR-170 (acrylic adhesive, vinyl base). In one embodiment, a two-part stressor layer can be formed on atop the upper surface S1 of base substrate 10, wherein a lower part of the two-part stressor layer is formed at a first temperature which is at room temperature or slight above (for example, from 15° C. to 60° C.), wherein an upper part of the two-part stressor layer comprises a spall inducing tape layer formed at an auxiliary temperature which is at room temperature. Typically, the spall inducing tape layer is employed in combination with a stressor layer of metallic nature.

If the stressor layer 5 is of a metallic nature, it typically has a thickness of from 3 μm to 50 μm, with a thickness of from 4 μm to 8 μm being more typical. Other thicknesses for a metallic stressor layer that are below and/or above the aforementioned thickness ranges can also be employed in the present disclosure. If the stressor layer 5 is of a polymeric nature, it typically has a thickness of from 10 μm to 200 μm, with a thickness of from 50 μm to 100 μm being more typical. Other thicknesses for a polymeric stressor layer that are below and/or above the aforementioned thickness ranges can also be employed in the present disclosure.

Figure 2:
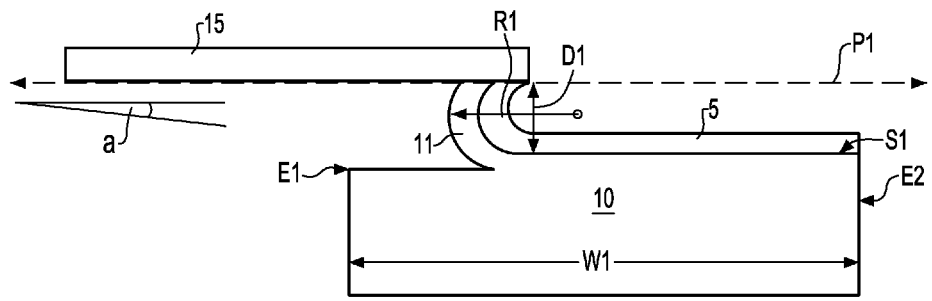
FIG. 2 is a side cross-sectional view depicting one embodiment of contacting the stressor layer with a planar transfer surface at a first edge of the base substrate, in accordance with the present disclosure.

FIG. 2 depicts one embodiment of contacting the stressor layer 5 with a planar transfer surface 15 at a first edge E1 of the base substrate 10. The planar transfer surface 15 provides the surface to which the spalled portion of the base substrate 10 is transferred. By "planar" it is meant that the surface is flat, i.e., laying in one plane. The planar transfer surface 15 may be provided by a handling substrate having an adhesive surface. In one embodiment, the handling substrate that provides the base material of the planar transfer surface 15 may comprise a semiconductor material, a glass, a ceramic, a metal, a polymer or a combination thereof. When the handling substrate comprises a semiconductor material, the semiconductor material may include, but is not limited to, Si, Ge, SiGe, SiGeC, SiC, Ge alloys, GaSb, GaP, GaAs, GaN, Al$_2$O$_3$, InAs, InP, and all other III-V or II-VI compound semiconductors, individually or in combination. In some embodiments, the handling substrate is a bulk semiconductor material. In other embodiments, the handling substrate may comprise a layered semiconductor material such as, for example, a semiconductor-on-insulator or heteroepitaxial layers grown on a single-crystal substrate. When the handling substrate comprises a semiconductor material, the semiconductor material can be doped, undoped or contain doped regions and undoped regions.

In one embodiment, the semiconductor material that can be employed as the handling substrate can be single-crystalline (i.e., a material in which the crystal lattice of the entire sample is continuous and unbroken to the edges of the sample, with no grain boundaries). In another embodiment, the semiconductor material that can be employed as the handling substrate can be polycrystalline (i.e., a material that is composed of many crystallites of varying size and orientation; the variation in direction can be random (called random texture) or directed, possibly due to growth and processing conditions). In yet another embodiment of the present disclosure, the semiconductor material that can be employed as the handling substrate can be amorphous (i.e., a non-crystalline material that lacks the long-range order characteristic of a crystal). Typically, the semiconductor material that can be employed as the handling substrate is a single-crystalline material.

When the handling substrate comprises a glass, the glass can be an $SiO_2$-based glass which may be undoped or doped with an appropriate dopant. Examples of $SiO_2$-based glasses that can be employed as the handling substrate include undoped silicate glass, borosilicate glass, phosphosilicate glass, fluorosilicate glass, and borophosphosilicate glass.

When the handling substrate comprises a ceramic, the ceramic is any inorganic, non-metallic solid such as, for example, an oxide including, but not limited to, alumina, beryllia, ceria and zirconia, a non-oxide including, but not limited to, a carbide, a boride, a nitride or a silicide; or composites that include combinations of oxides and non-oxides.

When the handling substrate comprises a metal, the metal can be a rigid metallic substrate or a thin metallic foil. Such metallic handling substrates include, but are not limited to, stainless steels, copper, aluminum, molybdenum, Invar, Kovar, as well as other metals and their alloys.

When the handling substrate comprises a polymer, the polymer can be a rigid substrate or a thin polymer film; with or without an adhesive surface for engaging the stressor layer 5 that is present on the base substrate 10. The adhesive may be provided by an adhesive tape, such as a pressure sensitive tape. Typically, the pressure sensitive tape that is employed for the adhesive component of the planar transfer surface 15 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. In addition to the aforementioned adhesive tape/pressure sensitive tape, the adhesive that is present on the handling substrate of the planar transfer surface 15 may be provided by a glue that is deposited on the handling substrate using brushing, spraying, dip coating, curtain deposition and combinations thereof. It is noted that the aforementioned examples of adhesives are provided for illustrative purposes only and are not intended to limit the present disclosure as any adhesive material is suitable that can be deposited on the handling substrate and can maintain connectivity between the planar transfer surface 15 and the base substrate 10, for example, stressor layer 5, during crack initiation and crack propagation in the spalling process.

In some embodiments, the handling substrate includes an adhesive for engaging the stressor layer 5 that is present on the base substrate 10. The adhesive may be provided by an adhesive tape, such as a pressure sensitive tape. Typically, the pressure sensitive tape that is employed for the adhesive component of the planar transfer surface 15 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. In addition to the aforementioned adhesive tape/pressure sensitive tape, the adhesive that is present on the handling substrate of the planar transfer surface 15 may be proved by a glue that is deposited on the handling substrate using brushing, spraying, dip coating, curtain deposition and combinations thereof. It is noted that the aforementioned examples of adhesives are provided for illustrative purposes only and are not intended to limit the present disclosure as any adhesive material is suitable that can be deposited on the handling substrate and can maintain connectivity between the planar transfer surface 15 and the base substrate 10, for example, stressor layer 5, during crack initiation and crack propagation in the spalling process.

In some embodiments, the planar transfer surface 15 may include a handle substrate without an adhesive for engaging the stressor layer 5 that is present on the base substrate 10. For example, in some embodiments, in which the adhesive is not present on the planar transfer surface 15, an adhesive may be present on the stressor layer 5, or may be the stressor layer 5 itself. The adhesive that is present on the stressor layer 5 may be similar to the adhesives that are described above with respect to the planar transfer surface 15 including, for example, adhesive tape and glue. As noted above in some embodiments, the stressor layer 5 may function as the adhesive that provides engagement to the planar transfer surface 14. In this embodiment, the stressor layer 5 may include a spalling tape, metal or polymer with adhesive qualities having a strength suitable to maintain connectivity between the planar transfer surface 15 and the base substrate 10 during crack initiation and crack propagation during the spalling process.

Following connection of the planar transfer surface 15 to the stressor layer 5, the planar transfer surface 15 is positioned along a plane P1 that is parallel to and vertically offset D1 from the upper surface S1 of the base substrate 10. By "parallel" it is meant that plane P1 and the upper surface S1 of the base substrate 10 are equal distance apart, i.e., vertically offset D1, at least along the width W1 dimension of the base substrate 10. Typically, the plane P1 and the upper surface S1 of the base substrate 10 are also equal distant apart, i.e., vertically offset, along the length dimension of the base substrate 10. The length dimension (not shown) of the base substrate 10 is perpendicular to the width W1 dimension of the base substrate 10, as well as being perpendicular to the dimension defined by the vertically offset D1, and travels into and out of the page.

In one embodiment, the plane P1 is vertically offset D1 by a dimension ranging from 0.1 cm to 20 cm. In another embodiment, the plane P1 is vertically offset by a dimension ranging from 0.2 cm to 10 cm. In yet another embodiment, the plane P1 is vertically offset by a dimension ranging from 0.5 cm to 5 cm. It is noted that the above provided dimensions are provided for illustrative purposes only, and are not intended to limit the present disclosure, as any dimension has been contemplated for the vertical offset D1 that is present between upper surface S1 of the base substrate and the plane P1 along which the planar transfer surface 15 is to be traversed, so long as the dimension of the vertical offset D1 allows for a uniform spalling force.

FIGS. 2-5 depict one embodiment of traversing the planar transfer surface 15 along a plane P1 that is parallel to and having a vertical offset D1 from the upper surface S1 of the base substrate 10 in a direction from the first edge E1 of the base substrate 10 to an opposing second edge E2 of the base substrate 10. Traversing the planar transfer surface 15 from the first edge E1 of the base substrate 10 to an opposing second edge E2 of the base substrate 10 cleaves the base substrate 10 and transfers a spalled portion 11 of the base substrate 10 to the planar transfer surface 15.

Figure 3:
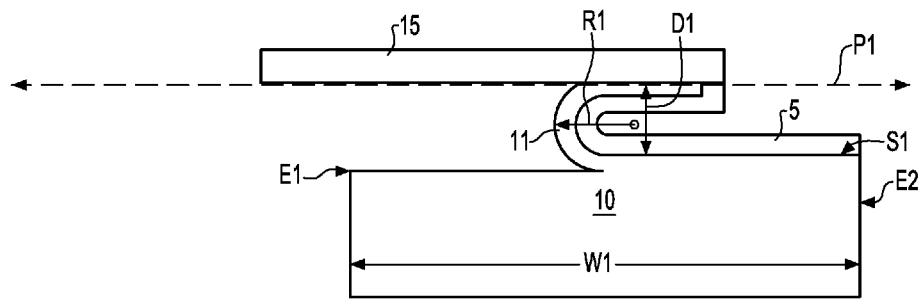
FIGS. 3 and 4 are side cross-sectional views depicting one embodiment of traversing the planar transfer surface along a plane that is parallel and having a vertical offset to the upper surface of the base substrate in a direction from the first edge of the base substrate to an opposing second edge of the base substrate to cleave the base substrate and transfer a spalled portion of the base substrate to the planar transfer surface, in accordance with the present disclosure.
Figure 4:
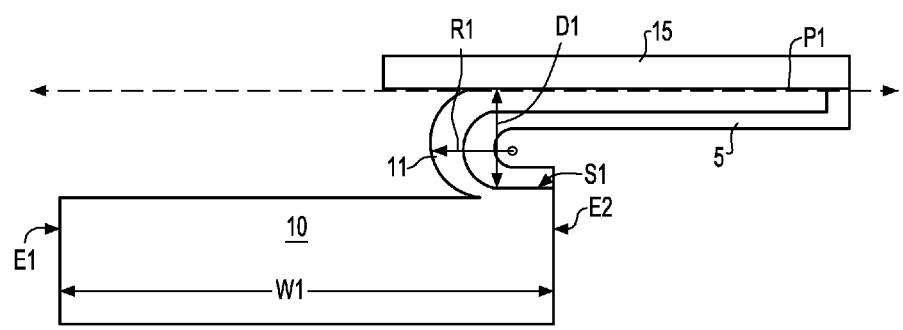
Figure 5:
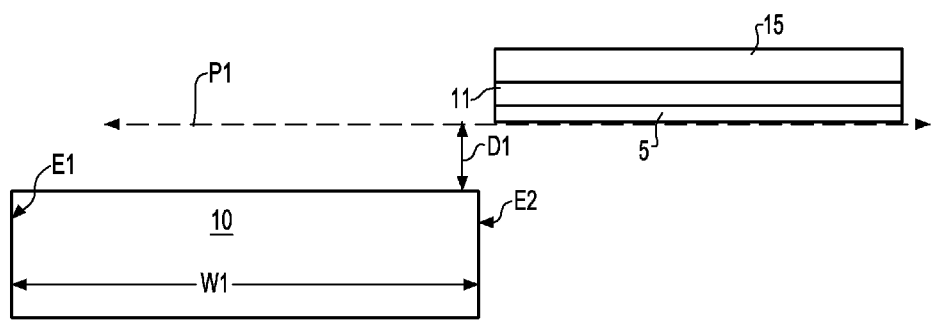
FIG. 5 is a side cross-sectional view depicting the spalled portion of the base substrate transferred to the planar transfer surface, in accordance with one embodiment of the present disclosure.

FIG. 2 depicts the spalling process after the initiation of substrate fracture that begins cleavage of the base substrate 10. FIG. 2 depicts propagation of the crack to approximately ¼ of the width W1 dimension of the base substrate 10. At this stage, approximately ¼ of the width W1 of the base substrate 10 has been cleaved, and approximately ¼ of the final dimension of the spalled portion 11 of the base substrate 10 has been transferred to the planar transfer surface 15. FIG. 3 depicts traversing the planar transfer surface 15 along approximately ½ of the width W1 dimension of the base substrate 10, and FIG. 4 depicts traversing the planar transfer surface 15 greater than ¾ of the width W1 dimension of the base substrate 10. As the planar transfer surface 15 is traversed across the width W1 of the base substrate 10, for example, as depicted in FIGS. 2-4, a uniform spalling force is applied to the base substrate 10. FIG. 5 depicts the planar transfer surface 15 after the planar transfer surface has been traversed past the second edge E2 of the base substrate 10, in which a completely transferred spalled portion 11 of the base substrate 10 is depicted engaged to the planar transfer surface 15.

Referring to FIGS. 2-5, traversing the planar transfer surface 15 along the plane P1 that is parallel to the upper surface S1 of the base substrate 10 may allow for a deviation by an angle α of 5 degrees from the plane P1 that is parallel to the upper surface S1 of the base substrate 10. The deviation from the parallel plane P1 may result from process variation within the mechanical structures that actuate the planar transfer surface 15 across the width W1 of the base substrate 10. By traversing the planar transfer surface 15 "entirely on" the plane that is parallel to the upper surface S1 of the base substrate 10 it is meant that the once the planar transfer surface 15 contacts the base substrate 10, i.e., stressor layer 5 on the base substrate 10, and reaches the plane P1 that is parallel to the upper surface S1 of the base substrate 10, the planar transfer surface 15 is traversed exactly along the plane P1 that is parallel to the upper surface S1 without any deviation therefrom.

As the planar transfer surface 15 is traversed across the width W1 of the base substrate 10 from the first edge E1 of the base substrate 10 to the second edge E2 of the base substrate 10, the vertical offset D1 between the plane P1 on which the planar transfer surface 15 is being traversed and the upper surface S1 of the base substrate 10 is at a fixed distance. By "fixed" it is meant that the distance D1 between the plane P1 along which the planar transfer surface 15 is traversed and the upper surface S1 of the substrate 10 is the same at any point across the width W1 of the base substrate 10 from the first edge E1 of the base substrate 10 to the second edge E2 of the base substrate 10. By maintaining the distance D1 between the plane P1 along which the planar transfer surface 15 is traversed and the upper surface S1 of the substrate 10, a uniform spalling force is applied to the base substrate 10 by the planar transfer surface 15 at each point across the width W1 of the base substrate 1 during spalling. In this manner, because the spalling force is uniform across the entire width W1 of the base substrate 1, the disclosed method provides a mechanism for a uniform and constant spalling force that can be applied during the entire layer transfer process following fracture initiation.

The constant spalling force is the result of the constant curvature condition imposed on the stressed bilayer formed by the spalled portion 11 and the stressor 5 under the mechanical constraint of fixed distance D1. In one embodiment, the distance D1 can be chosen to ensure that the curvature of the spalled portion 11 is close to its equilibrium value (the natural curvature of the stressed spalled portion 11 and stressor 5 bilayer). The curvature, K, of a strained bilayer is given by:

$$K = \frac{6E_1E_2(h_1+h_2)h_1h_2\varepsilon}{E_1^2h_1^4 + 4E_1E_2h_1^3h_2 + 6E_1E_2h_1^2h_2^2 + 4E_1E_2h_2^3h_1 + E_2^2h_2^4}$$

Where $E_1$ and $h_1$ are the Young's modulus and thickness of one material in the bilayer (e.g., stressor 5), $E_2$ and $h_2$ are the Young's modulus and thickness of the other material, and $\varepsilon$ is the misfit strain. The misfit strain, $\varepsilon$, is the difference in strain in each layer; $\varepsilon=(\varepsilon_1-\varepsilon_2)$. The residual strain in both the spalled portion 11 and the overlying stressor 5 can be derived by applying conservation of energy and equilibrium of in-plane forces. The strain in the spalled portion 11 and overlying stressor 5 is given by:

$$\varepsilon_{11} = \left[\frac{\kappa_5 h_5 \varepsilon_5^{i2} - 2\gamma_{10}}{\kappa_5 \left(\frac{M_{11}h_{11}}{M_5h_5}\right)^2 h_5 + \kappa_{11}h_{11}}\right]^{1/2}$$

$$\varepsilon_5 = \frac{-M_{11}t_{11}\varepsilon_{11}}{M_5t_5}$$

Where $\kappa_x$ is given by $(E_x/(1-\upsilon_x))$ and $\upsilon_x$ is the poisson ratio of layer x, $M_x$ is given by $(E_x/(1-\upsilon_x^2))$, $\varepsilon^i$ is the initial strain in the stressor 5 prior to spalling, $2\gamma$ is the energy lost in forming 2 new surfaces, and the subscripts denote the layers defined in FIGS. 2-5. The misfit strain is then given by the difference $\varepsilon_5-\varepsilon_{11}$. The radius of curvature R is given by the inverse of the curvature, $R=K^{-1}$. The surface energy term changes the radius of curvature by approximately 10% (for the case of Si as base substrate 10). Likewise, additional surface polymer handling layers applied to the stressor 5 prior to controlled spalling would tend to increase the radius of curvature. The vertical offset D1, therefore, that corresponds to equilibrium curvature of spalled portion 11 is twice the radius of curvature.

Because the vertical offset D1 between the plane P1 along which the planar transfer surface 15 and the upper surface S1 of the base substrate 10 is fixed, the applied force is always at a constant spalling radius of curvature R1 with respect to the upper surface S1 of the base substrate 10. A constant spalling radius of curvature R1 provides fixed curvature force loading as the spalled portion 11 of the base substrate 10 is separated from the base substrate 10, and transferred to the planar transfer surface 15. In some embodiments, the advantage of propagating fracture under the condition of fixed curvature force loading is that it stabilizes the trajectory of the crack tip, thereby improving fracture depth (film thickness uniformity) and oscillatory stability (film roughness). In one embodiment, the constant spalling radius of curvature R1 ranges from 0.1 cm to 20 cm. In another embodiment, the constant spalling radius of curvature R1 ranges from 0.5 cm to 10 cm. In some embodiments, the constant spalling radius of curvature R1 contributes to a constant and uniform spalling force.

Traversing the planar transfer surface 15 along the plane P1 that is parallel to the upper surface S1 of the base substrate 10 in the direction from the first edge E1 of the base substrate 10 to the opposing second edge E2 of the base substrate 10 includes traversing the planar transfer surface 15 at a speed ranging from 1 centimeter/second to 1000 meters/second. In another embodiment, the planar transfer surface 15 is traversed across the width W1 of the base substrate 10 at a speed ranging from 0.1 meter/second to 100 meter/second. In yet another embodiment, the planar transfer surface 15 is traversed across the width W1 of the base substrate 10 at a speed ranging from 0.2 meter/second to 50 meter/second.

The spalling process can be initiated at room temperature or at a temperature that is less than room temperature. In one embodiment, spalling is performed at room temperature (i.e., 20° C. to 40° C.). In another embodiment, spalling is performed at a temperature less than 20° C. In a further embodiment, spalling occurs at a temperature of 77° K or less. In an even further embodiment, spalling occurs at a temperature of less than 206° K. In still yet another embodiment, spalling occurs at a temperature from 175° K to 130° K.

When a temperature that is less than room temperature is used, the less than room temperature spalling process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When spalling is performed at a temperature that is below room temperature, the spalled structure is returned to room temperature by allowing the spalled structure to slowly cool up to room temperature by allowing the same to stand at room temperature. Alternatively, the spalled structure can be heated up to room temperature utilizing any heating means.

FIG. 5 depicts the spalled portion 11 of the base substrate 10 transferred to the planar transfer surface 15. The thickness of the spalled portion 11 of the base substrate 10 shown in FIG. 5 varies depending on the material of the stressor layer 5 and the material of the base substrate 10 itself. In one embodiment, the spalled portion 11 of the base substrate 10 has a thickness of less than 100 microns. In another embodiment, the spalled portion 5 of the base substrate 10 has a thickness of less than 50 microns. Although not depicted in FIG. 5, the stressor layer 5 may be removed after the spalled portion of the base substrate 10 is transferred to the planar transfer surface 15. For example, and in one embodiment, aqua regia ($HNO_3$/HCl) can be used for removing the stressor layer 5 from the spalled portion 11 of the base substrate 10.

Figure 6:
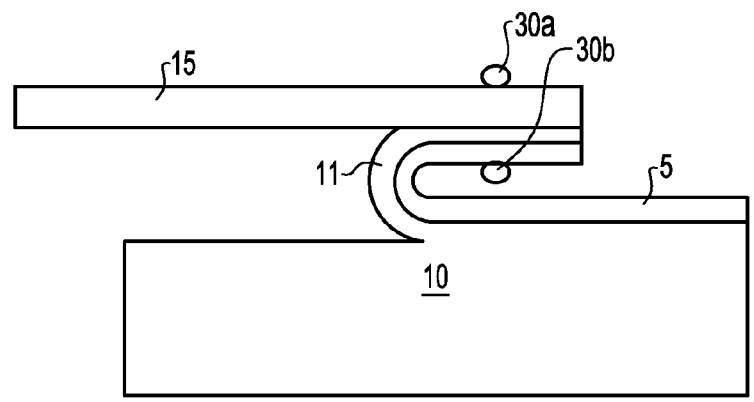
FIG. 6 is a side cross-sectional view depicting rollers to press the stressor layer to the planar transfer surface, in accordance with one embodiment of the present disclosure.

FIG. 6 depicts one embodiment of rollers 30a, 30b to press the spalled portion 11 of the base substrate 10 to the planar transfer surface 15. The rollers 30a, 30b are positioned to apply a force to avoid the formation of voids between the planar transfer surface 15 and the spalled portion 11 of the base substrate 10. A first roller 30a may be present in direct contact with a surface of the planar transfer surface 15 that is opposite the surface of the planar transfer surface 15 that the spalled portion 11 of the base substrate 10 is bonded to. A second roller 30b may be present in contact with the stressor layer 5. The first and second rollers 30a, 30b apply opposing forces that substantially reduce, if not eliminate, void formation between the planar transfer surface 15 and the spalled portion 11 of the base substrate 10. The first and second rollers 30a, 30b may be composed of any material, including but not limited to, metals, polymers, elastomers and ceramics. In one embodiment, the first and second rollers 30a, 30b are composed of rubber-coated stainless steel.

Figure 7:
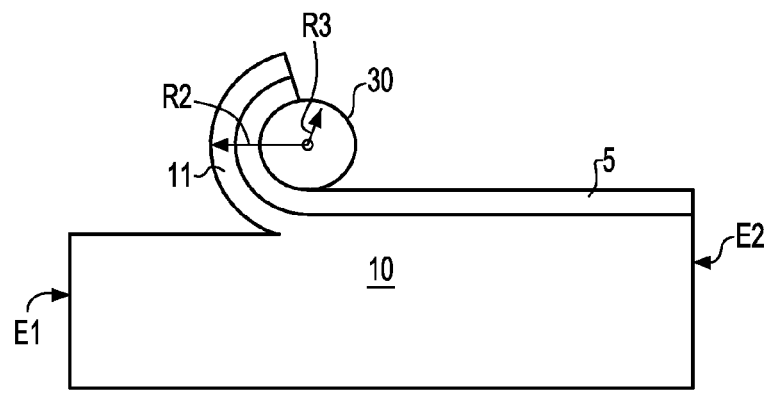
FIG. 7 is a side cross-sectional view depicting a transfer roller for transferring a material layer, in accordance with one embodiment of the present disclosure.

FIG. 7 is a side cross-sectional view depicting a transfer roller 50 for transferring a material layer (hereafter referred to as a spalled portion 11 of the base substrate 10), in accordance with another embodiment of the present disclosure. In the embodiment depicted in FIG. 7, a transfer roller 30 applies a spalling force to the base substrate 10 to cleave the base substrate 10 in a spalling process. Similar to the embodiments depicted in FIGS. 1-5, a stressor layer 5 is applied to the base substrate 10 that is depicted in FIG. 7. The description of the stressor layer 5 and the base substrate 10 that are depicted in FIGS. 1-5 are suitable for the stressor layer 5 and the base substrate 10 that are depicted in FIG. 7.

The method of transferring the spalled portion 11 of the base substrate 10 depicted in FIG. 7 includes contacting the stressor layer 5 with a transfer roller 30 at a first edge E1 of the base substrate 10, and rolling the stressor layer 5 across the width W1 of the base substrate 10 while applying a force to achieve spalling. During spalling, the transfer roller 30 applies a mechanical force to the stressor layer 5 such that the direction of the applied force is at a constant radius of curvature R2. At least one of the transfer roller 30 and the stressor layer 5 includes an adhesive surface so that upon contact the transfer roller 30 and the stressor layer 5 are engaged to one another. The adhesive may be provided by an adhesive tape, such as a pressure sensitive tape, or may include vacuum or electrostatic chucking. In some embodiments, the pressure sensitive tape may include an adhesive layer and a base layer. Materials for the adhesive layer and the base layer of the pressure sensitive tape include polymeric materials such as, for example, acrylics, polyesters, olefins, and vinyls, with or without suitable plasticizers.

Some examples of adhesive tapes that can be used in the present disclosure as an adhesive between the stressor layer 5 and the transfer roller 30 include, for example, Nitto Denko 3193MS thermal release tape, Kapton KPT-1, and Diversified Biotech's CLEAR-170 (acrylic adhesive, vinyl base). In addition to the aforementioned adhesive tape/pressure sensitive tape, the adhesive may be proved by a glue that is deposited on at least one of the stressor layer 5 and the transfer roller 30 using brushing, spraying, dip coating, curtain deposition and combinations thereof. It is noted that the aforementioned examples of adhesives are provided for illustrative purposes only and are not intended to limit the present disclosure, as any adhesive material is suitable that can be deposited on the stressor layer 5 and/or transfer roller 30, and can maintain connectivity between the stressor layer 5 and the transfer roller 30 during crack initiation and crack propagation.

In some embodiments, the uniform spalling force is accomplished by traversing a transfer roller 30 with a fixed radius R3, in which the spalled portion 11 of the base substrate 10 is peeled onto the transfer roller 30. In some embodiments, because the spalled portion 11 of the base substrate 10 is peeled by a transfer roller 30 having a fixed radius R3, the crack propagation provided by the transfer roller 30 being rolled across the width W1 of the base substrate 10 is under a condition of fixed curvature force loading that stabilizes the trajectory of the crack tip. By "fixed curvature force" it is meant that the applied force that provides crack propagation is always at a constant spalling radius of curvature R2 with respect to the upper surface S1 of the base substrate 10. The constant spalling radius of curvature R2 ranges from 0.1 cm to 20 cm. In another embodiment, the constant spalling radius of curvature R2 ranges from 0.5 cm to 10 cm.

In one embodiment, the radius R3 of transfer roller 30 is selected to provide a curvature that is equal to an equilibrium curvature of the spalled portion 11 of the base substrate 10 that is being transferred to the transfer roller 30. In one embodiment, when the stressor layer 5 and spalled portion 11 of the base substrate 10 is allowed to spall in such a manner that the curvature of the combination of the stressor layer 11 and spalled portion 11 of the base substrate 10 is near its equilibrium curvature, the result is a smooth surface, and a consistent and stable fracture geometry. In one embodiment, the radius R3 of the transfer roller 30 is selected so that the diameter of the transfer roller 30 is substantially equal to or greater than the width w1 of the base substrate 10. In this manner, a spalled portion 11 of the base substrate 10 having a dimension that is equal to the entire width W1 of the base substrate 10 may be transferred to the transfer roller 30 without the spalled portion 11 overlapping itself on the transfer roller 30. In one embodiment, the radius R3 of the transfer roller 30 ranges from 0.1 cm to 50 cm. In another embodiment, the radius R3 of the transfer roller 30 ranges from 0.2 cm to 20 cm. In yet another embodiment, the radius R3 of the transfer roller 30 from 0.5 cm to 10 cm. The transfer roller 30 may be composed of any material, including but not limited to, metals, polymers and ceramics. In one embodiment, the transfer roller 30 is composed of stainless steel.

The traversing of the transfer roller 30 from the first edge E1 of the base substrate 10 to a second edge E2 of the base substrate 10 may be at a constant speed ranging from 0.1 meters/second to 100 meters/second. In one embodiment, the spalled portion 11 of the base substrate 10 that is transferred to the transfer roller 30 has a thickness ranging from 10 nm to 100 μm.

While the present disclosure has been particularly shown and described with respective to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims

The invention claimed is:

1. A method of transferring a material layer comprising:
depositing a stressor layer on an upper surface of a base substrate;
contacting the stressor layer with a transfer roller at a first edge of the base substrate, wherein a radius of the transfer roller is selected to provide a roller curvature that is equal to an equilibrium curvature of the material layer being transferred from the base substrate to the transfer roller; and
traversing the transfer roller from the first edge of the base substrate to a second edge of the base substrate to cleave the base substrate into a remaining portion and a spalled portion, wherein the spalled portion of the base substrate is the material layer being transferred to the transfer roller.

2. The method of claim 1, wherein the base substrate comprises a semiconductor material.

3. The method of claim 1, wherein the base substrate has a fracture toughness that is less than the stressor layer.

4. The method of claim 1, wherein the stressor layer comprises a metal, a polymer, a spalling inducing tape or a combination thereof.

5. The method of claim 1, further comprising forming an adhesion layer between the stressor layer and the base substrate.

6. The method of claim 1 wherein the transfer roller further comprises an adhesive to engage the stressor layer.

7. The method of claim 1, wherein the traversing of the transfer roller from the first edge of the base substrate to a second edge of the base substrate to cleave the base substrate provides a uniform spalling force.

8. The method of claim 1, wherein the traversing of the transfer roller from the first edge of the base substrate to a second edge comprises a constant speed ranging from 1 centimeter/second to 1000 meters/second.

9. The method of claim 1, wherein the spalled portion of the base substrate has a thickness of less than 100 microns.

10. The method of claim 1, wherein said traversing the transfer roller from the first edge of the base substrate to the second edge of the base substrate comprises rolling the transfer with while applying a force to said transfer roller.

11. The method of claim 10, wherein said force is a mechanical force.

12. The method of claim 1, wherein both said transfer roller and said stressor layer includes an adhesive present thereon.

13. The method of claim 1, wherein said transfer roller is brought into contact with said stressor layer under vacuum.

14. The method of claim 1, wherein said transfer roller is comprised of a metal, a polymer or a ceramic.

15. The method of claim 1, wherein said transfer roller is comprised of stainless steel.

16. The method of claim 1, wherein said transfer roller has a radius that is substantially equal to or greater than a width of the base substrate.

* * * * *